United States Patent [19]
Roberts

[11] Patent Number: 5,361,003
[45] Date of Patent: Nov. 1, 1994

[54] ADJUSTABLE BUFFER DRIVER

[75] Inventor: Gregory N. Roberts, Boise, Id.

[73] Assignee: Micron Semiconductor, Inc., Boise, Id.

[21] Appl. No.: 4,363

[22] Filed: Jan. 14, 1993

[51] Int. Cl.$^5$ ............................................. H03K 17/16
[52] U.S. Cl. ...................................... 326/21; 326/83; 326/62; 327/108
[58] Field of Search ................. 307/443, 451, 270, 469

[56] References Cited
U.S. PATENT DOCUMENTS

| | | | |
|---|---|---|---|
| 4,719,369 | 1/1988 | Asano | 307/469 |
| 5,039,874 | 8/1991 | Anderson | 307/451 |
| 5,051,625 | 9/1991 | Ikeda | 307/451 |
| 5,153,450 | 10/1992 | Reutz | 307/443 |
| 5,192,881 | 3/1993 | Martin | 307/443 |

Primary Examiner—Edward P. Westin
Assistant Examiner—Andrew Sanders
Attorney, Agent, or Firm—David J. Paul

[57] ABSTRACT

The basic concept of the present invention comprises converting a standard buffer circuit into an adjustable buffer circuit that will in effect reduce the operating speed and power consumption of the IC in which it is constructed. An adjustable buffer circuit can be designed into a chip design that will allow manufacturing to either use a bonding option or the blowing of a fuse to adjust its operating speed and active power consumption. One important application would be in memory devices such as for static random access memory (SRAM) devices. For example, if may be desirable to allow a $-15$ ns access time SRAM to be downgraded to a $-20$ ns or $-35$ ns access time device while lowering its active power consumption by $\approx 20$-$30\%$ so that it will pass the $-35$ ns $I_{CC}$ specification rating. Although the concept of the present invention would require more layout area on the die, by appropriately bonding or blowing a fuse to control the adjustable circuitry, slower speed grades that meet power rating specifications are obtained.

8 Claims, 8 Drawing Sheets

TABLE 1

|    | tprop    | Δt       | peak I  | Δ power |
|----|----------|----------|---------|---------|
| 51 | 700 ps   | 0 ps     | 1.5 mA  | 0%      |
| 52 | 950 ps   | 250 ps   | 1.25 mA | 17%     |
| 53 | 1,300 ps | 600 ps   | 0.95 mA | 37%     |
| 54 | 1,800 ps | 1,100 ps | 0.78 mA | 48%     |
| 55 | 2,500 ps | 1,800 ps | 0.56 mA | 63%     |

FIG. 6

TABLE 2

| | full buffer SELECT=1 SELECT*=0 | partial buffer SELECT=0 SELECT*=1 |
|---|---|---|
| tprop output @ 1.5 V @ 2.4 V | 3.5 ns 4.5 ns | 9.0 ns 12.0 ns |
| I output driver | 1.25 mA | 0.50 mA |
| I output buffer | 25.0 mA | 10.5 mA |
| total power | 26.25 mA | 11.00 mA |

ADJUSTABLE BUFFER DRIVER

FIELD OF THE INVENTION

This invention relates generally to buffer circuits and driver circuits constructed for semiconductor devices and in particular to an adjustable CMOS buffer/driver circuit.

BACKGROUND OF THE INVENTION

As access times decrease for the high-end semiconductor market, the speed and power specifications are violated for the integrated circuits (ICs) with slower speed grades.

FIG. 1 shows a common complimentary metal oxide semiconductor (CMOS) inverter (also referred to as a buffer) with a p-channel metal oxide semiconductor (PMOS) transistor M1 and n-channel metal oxide semiconductor (NMOS) transistor M2. Typically, the method to reduce propagation delays in this common inverter would be accomplished by increasing the sizing of transistors M1 and M2. This creates a power consumption problem if the device containing a buffer with certain sized transistors is used in a unit or system that requires a device having a slower speed grade.

One way to solve this problem would be by creating the ability to reduce both the operating speed and operating power for the device used in products that are destined for slower applications.

In the present invention, a standard buffer or driver circuit is converted into an adjustable buffer circuit, thereby allowing the speed and power consumption to be reduced.

SUMMARY OF THE INVENTION

The basic concept of the present invention comprises converting a standard buffer circuit into an adjustable buffer circuit that will in effect reduce the operating speed and power consumption of the IC in which it is constructed.

An adjustable buffer circuit can be added into an IC design that will allow manufacturing to either use a bonding option or the blowing of a fuse to adjust its operating speed and active power consumption.

One embodiment of the present invention is an adjustable buffer or driver structure for a semiconductor device constructed on a substrate, with the adjustable buffer comprising:

a) a first set of electrical devices connected to a common output node;

b) a second set of electrical devices connected to the common output node, the second set of electrical devices having control means for activating and deactivating the second set;

c) means for providing control signals to the control means; and d) control signal adjusting means to determine the states of the control signals.

Another embodiment is an adjustable output driver/output buffer structure for a semiconductor device constructed on a substrate, said adjustable driver structure comprising:

a) a first set of electrical devices comprising a CMOS inverter electrically connected to a common drive node;

b) a second set of electrical devices comprising an n-channel transistor series stack, electrically connected to the common output node and a p-channel transistor series stack electrically connected to the common drive node, the second set of electrical devices having control means for activating and deactivating the second set;

c) a third set of electrical devices comprising a CMOS inverter electrically connected to a common output node;

d) a fourth set of electrical devices comprising an n-channel transistor series stack electrically connected to the common output node and an n-channel transistor series stack electrically connected to the common output node, the fourth set of electrical devices having control means for activating and deactivating the fourth set;

e) means for providing control signals to the control means; and f) control signal adjusting means to determine the states of the control signals.

One important application would be in memory devices such as for static random access memory (SRAM) devices. For example, if may be desirable to allow a −15 ns access time SRAM to be downgraded to a −20 ns or −35 ns access time device while lowering its active power consumption by ≈20–30% so that it will pass the −35 ns $I_{CC}$ specification rating.

Although the concept of the present invention would require more layout area on the die, by appropriately bonding or blowing a fuse to control the adjustable circuitry, slower speed grades that meet power rating specifications can be obtained.

BRIEF DESCRIPTION OF THE DRAWINGS

FIG. 6 is a table containing various operating specifications of the buffer curves depicted in FIG. 5;

FIG. 10 is a table containing various operating specifications of the CMOS buffer/driver curves depicted in FIGS. 8 and 9.

DETAILED DESCRIPTION OF THE PREFERRED EMBODIMENTS

Several embodiments of the present invention are depicted in the combinations of FIGS. 2–4 and FIGS. 2, 3 and 7, while the operation of these various embodiments is further illustrated in the associated graphs and charts of FIGS. 5 and 6 and 8–10.

Figure 2:
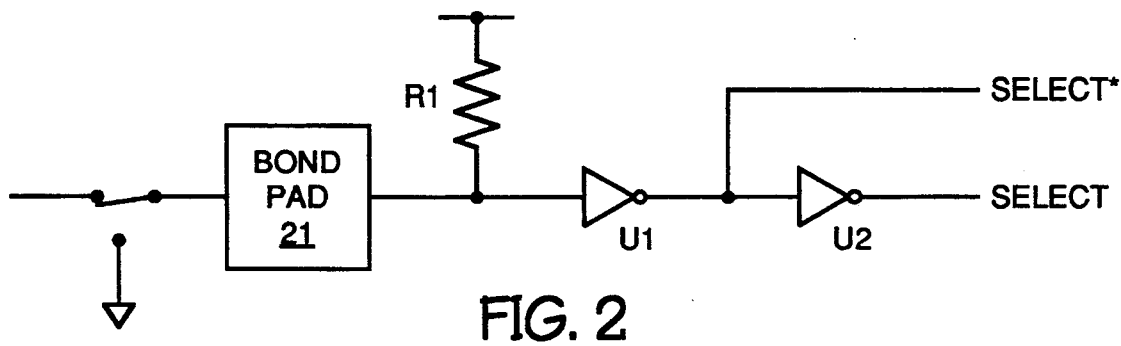
FIG. 2 depicts a schematical representation of a bonding pad option and circuitry used to create the desired inputs to an adjustable CMOS buffer/driver circuit.
Figure 3:
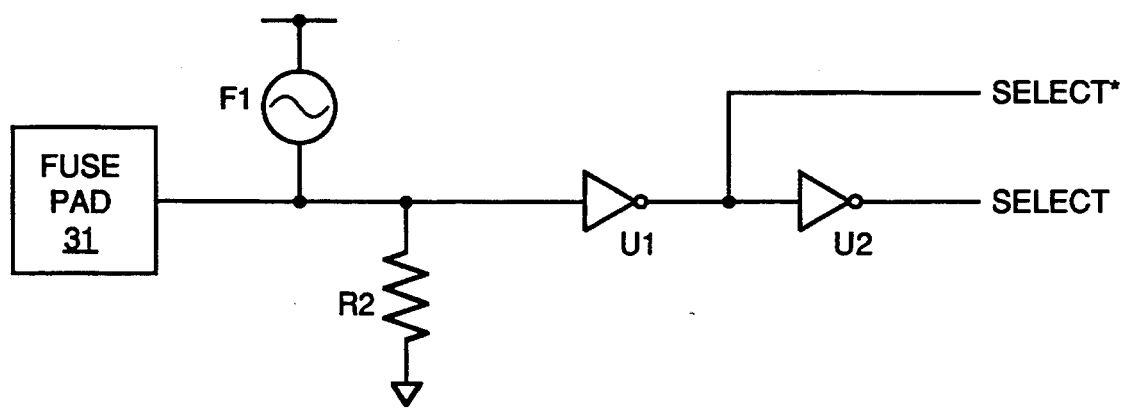
FIG. 3 depicts a schematical representation of a fuse pad option and circuitry used to create the desired inputs to an adjustable CMOS buffer/driver circuit.

Referring now to FIGS. 2 and 3, control signals Select and Select* are generated by a set of CMOS inverters U1 and U2. The input to U1 is electrically connected to a power supply (typically $V_{CC}$) via pullup resistor R1, as in FIG. 2, or the input to U1 is connected to a power supply (typically $V_{CC}$) via a fuse F1 and to a low potential (typically $V_{SS}$) via pulldown resistor R2, as in FIG. 3. There is an added feature at the input to U1 in both FIGS. 2 and 3 that allows the manufacturer to change the states of Select and Select* in order to adjust the operating speed and operating power of an adjustable buffer circuit. As shown, the input of U1 is also connected to either a bonding pad 21 (shown in FIG. 2) or a fuse pad 31 (shown in FIG. 3).

When using the bonding pad option of FIG. 2, the manufacturer may bond pad 21 to a low potential, such as $V_{SS}$, to change the states of Select and Select* from that of their normal operating states. When using the fuse pad option of FIG. 3, the manufacturer may blow a fuse (F1) via pad 31 thereby disconnecting the input from a high potential to allow R2 to pull the input down to a low potential, such as $V_{SS}$, to change the states of Select and Select*. Having the above capability to control these two signals becomes apparent from the following discussion when this concept is implemented into the circuits of FIGS. 4 and 7.

Figure 4:
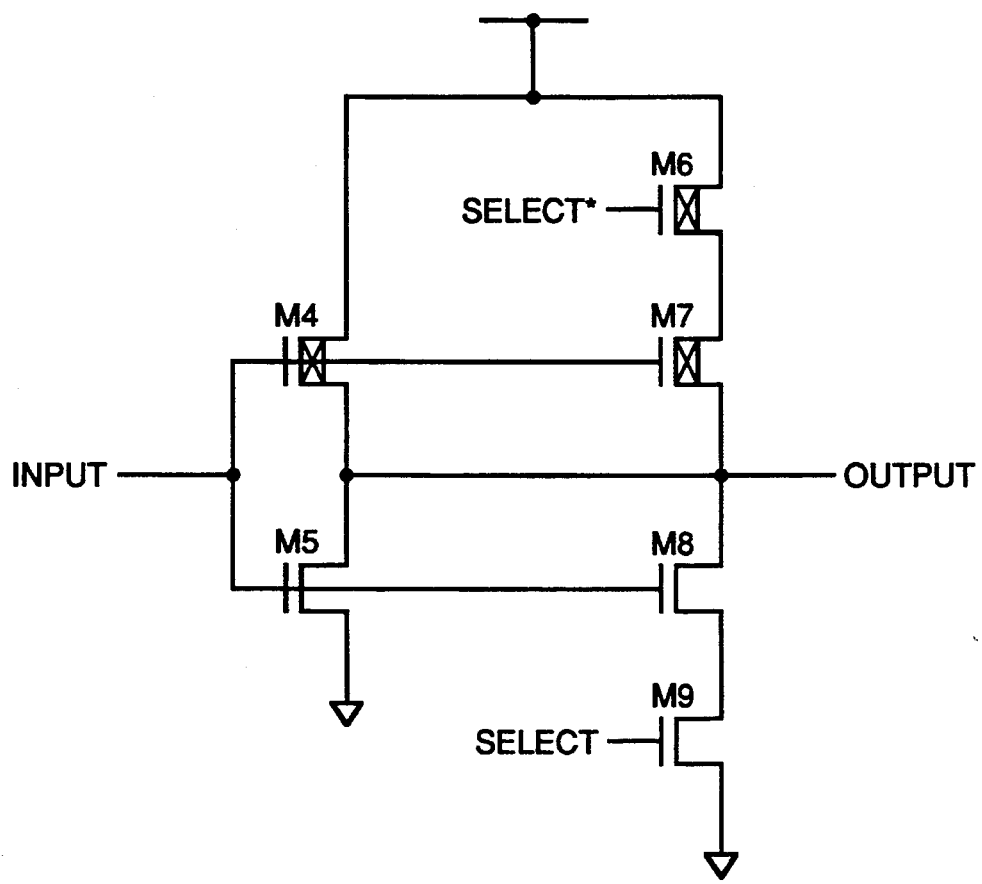
FIG. 4 depicts a schematical representation of an adjustable CMOS buffer circuit using the concept of the present invention.

Referring now to FIG. 4, an adjustable buffer is shown made up of a CMOS inverter comprising p-channel M4 and n-channel M5 and the CMOS series set of transistors comprising p-channel devices M6 and M7 and n-channel devices M8 and M9. The CMOS inverter and the CMOS series set both drive the same output node with the series set providing higher output current drive, as well as faster circuit speed, than if the CMOS inverter operated alone. The gates of M6 and M9 are controlled by Select and Select* signals provided by the set of CMOS inverters U1 and U2 of either FIGS. 2 or 3. In normal operation Select, and Select are such that M6 and M9, respectively, are gated on so the CMOS series set is active. However, if it is desirable to reduce the speed and operating power of a device in which the present invention is fabricated, the bonding option of FIG. 2 or the fuse option of FIG. 3 is used to connect the input of U1 to a low potential (such as $V_{SS}$) which will in turn change the states of Select* and Select and turn off M6 and M9. Now that M6 and M9 are off the CMOS series set is deactivated, thereby leaving only the CMOS inverter active. This will reduce the operating speed and output drive current of the device and allow the device to operate within the specifications of the desired slower speed grade.

Figure 1:
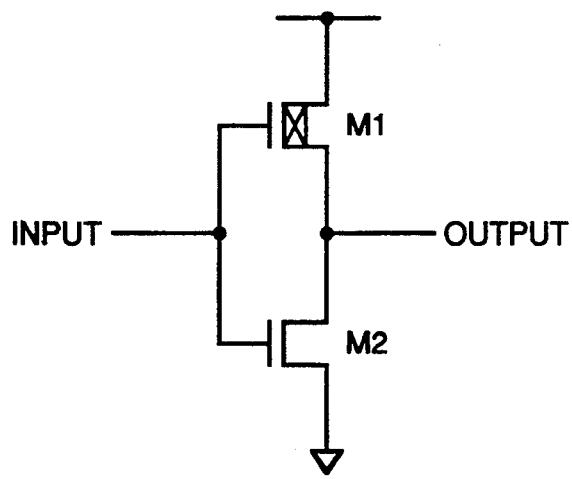
FIG. 1 depicts a schematical representation of typical CMOS buffer circuit.
Figure 5:
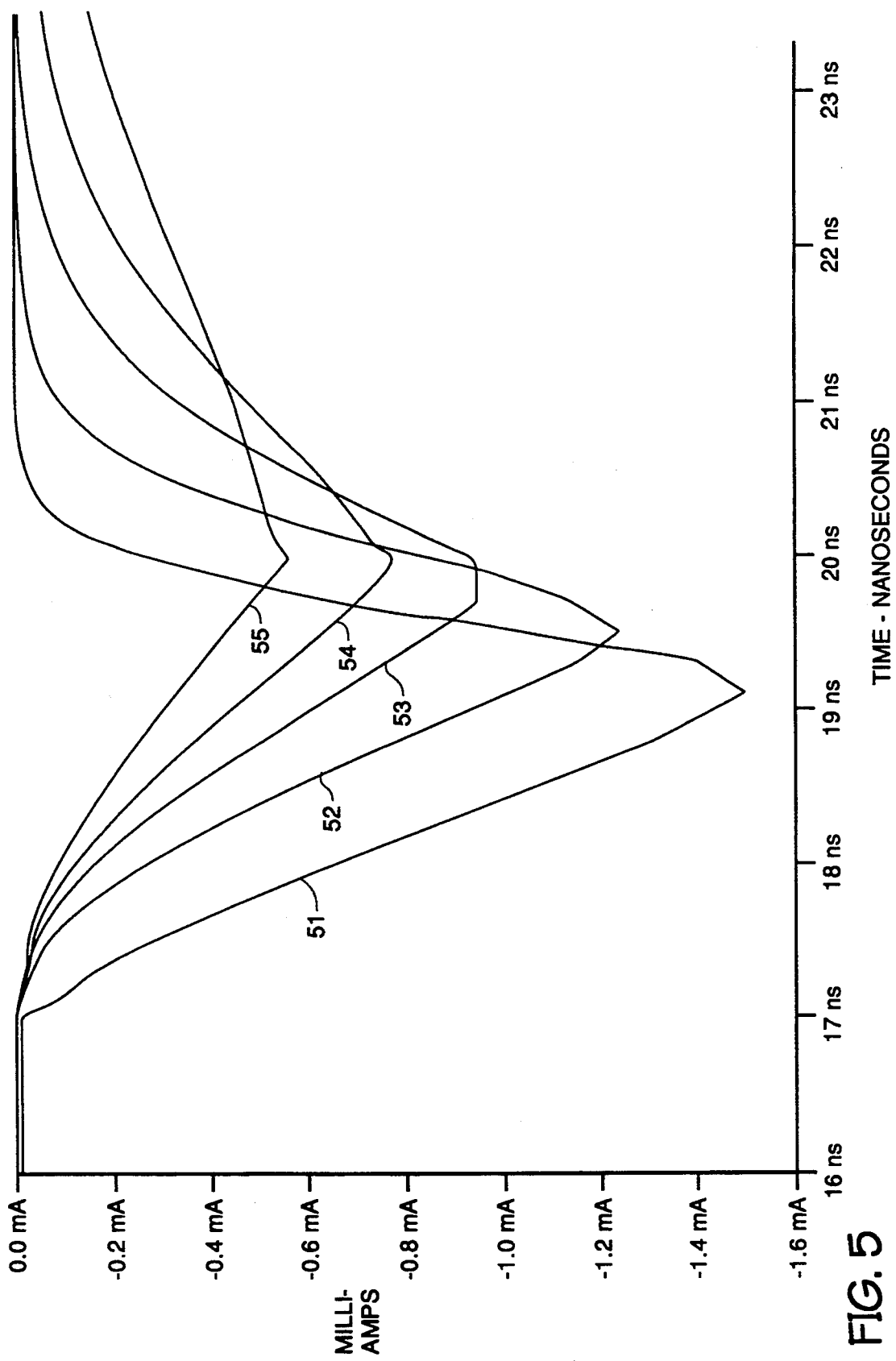
FIG. 5 depicts operating current curves that compare a typical CMOS buffer to adjustable buffers having various transistor sizing.

FIG. 5 depicts power operating curves of various buffers ranging from a typical buffer (of FIG. 1) to several adjustable buffers (represented by FIG. 4) comprising transistors of various sizing. The table of FIG. 6 correlates the results of each buffer curve shown in FIG. 5.

In comparing the typical buffer power curve to an adjustable buffer take the comparison between the buffers curves 51 and 55 for example. Referring now to both FIGS. 5 and 6, curve 51 represents a typical buffer having a propagation delay of 700 ps and an operating current of 1.5 mA. Curve 55, represents an adjustable buffer that has been adjusted by either the bonding pad option or fuse option which has a propagation delay of 2500 ps and an operating current of 0.56 mA. This adjustable buffer realizes a 63% reduction in operating power. The transistor sizing selected for each transistor will determine the amount of speed and power reduction gained. For example, in FIG. 1, if M1 is a 100 μ wide device and M2 is a 50 μ wide device (a sizing ratio of 100/50), then to obtain a comparable operating speed for normal operation, the adjustable buffer of FIG. 4 is sized such that M4 is 25 μ, M5 is 13 μ, M6 and M7 are 150 μ, and M8 and M9 are 70 μ. Now once the buffer is adjusted (thus deactivating the CMOS series set of M6, M7, M8 and M9), M4 and M5 remain as the only active devices to result in a sizing ratio of 25/13 and consequently a 3.5 X multiple in propagation delay and a power reduction of 63%. Therefore, the desired operating speed and operating power of the adjustable buffer can be designed into the buffer as desired. The other buffer curves 52, 53 and 54 follow the example as set forth above.

Figure 7:
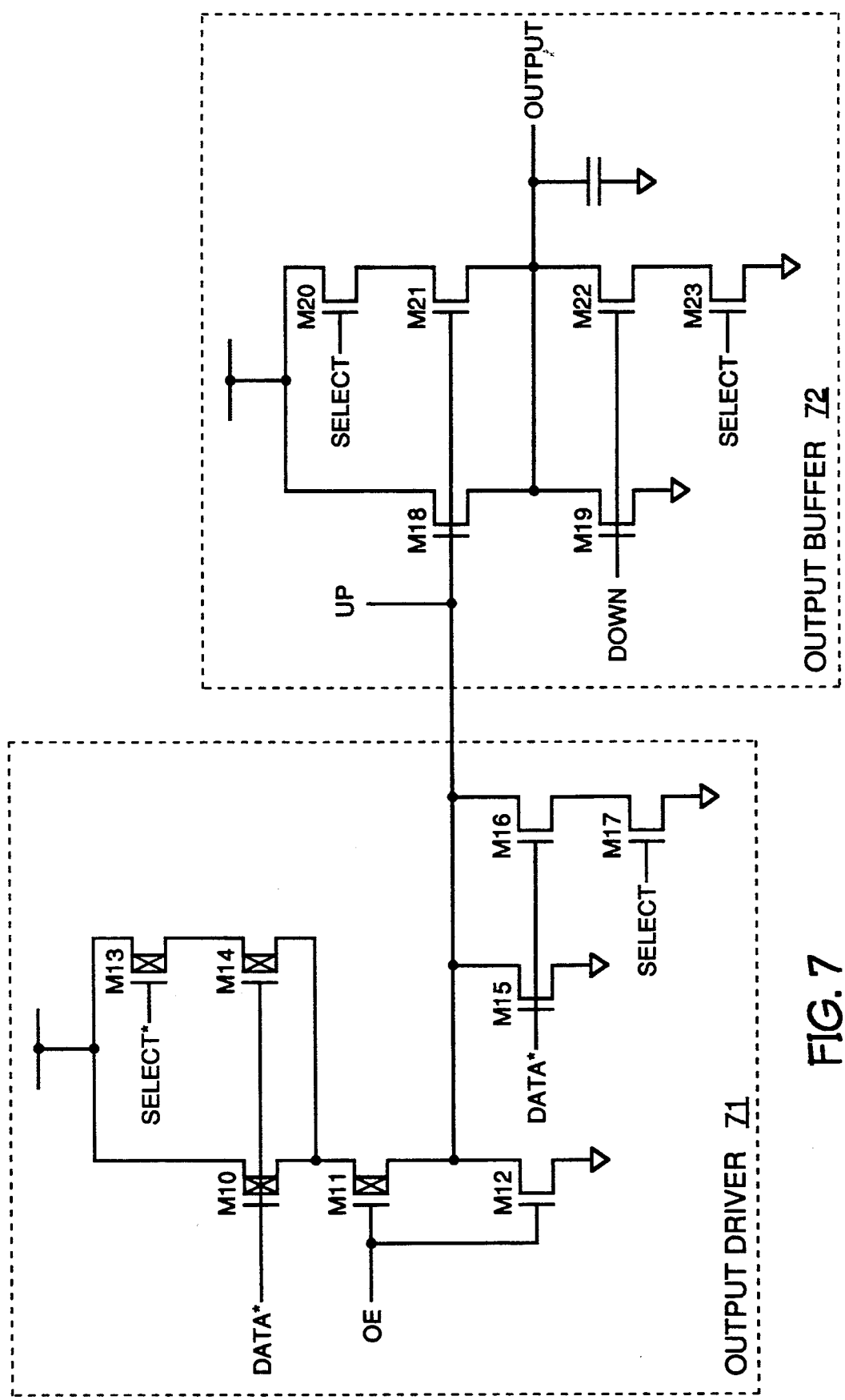
FIG. 7 depicts a schematical representation of an adjustable output CMOS buffer/driver circuit using the concept of the present invention.

Referring now to FIG. 7, a circuit comprising an adjustable output driver and an adjustable output buffer is shown. Output driver 71 comprises p-channel devices M10 and M11 in series with n-channel devices M12 and M15 in parallel. These devices are used for data control and transfer. The adjustable portion of output driver 71 comprises series p-channel devices M13 and M14, connected in parallel to M10, and series n-channel devices M16 and M17, connected in parallel to M12 and M15. The gates of M13 and M17 are controlled by Select* and Select signals, respectively, and these signals are provided by the set of CMOS inverters U1 and U2 of either FIGS. 2 or 3. In normal operation Select and Select* are such that M16 and M17 are gated on to provide greater circuit speed and current drive. However, if it is desirable to reduce the speed and operating power of a device in which the present invention is fabricated, the bonding option of FIG. 2 or the fuse option of FIG. 3 is used to connect the input of U1 to a low potential (such as $V_{SS}$) which will in turn change the states of Select and Select* and turn off M13 and M17. Now that M13, M14, M16 and M17 are deactivated, the operating speed and output drive current of the device will be reduced allowing the device to operate within the specifications of the desired slower speed grade.

Referring again to FIG. 7, an adjustable output buffer 72 is shown made up of a MOS inverter comprising p-channel transistor M18 and n-channel transistor M19 and the MOS series set of transistors comprising p-channel devices M20 and M21, and n-channel devices M22 and M23. The operation of this adjustable output buffer operates in the same manner as the adjustable buffer depicted in FIG. 4 which will likewise, reduce the operating speed and output drive current (or operating power) of the device and now allow the device to operate within the specifications of the desired slower speed grade.

Figure 8:
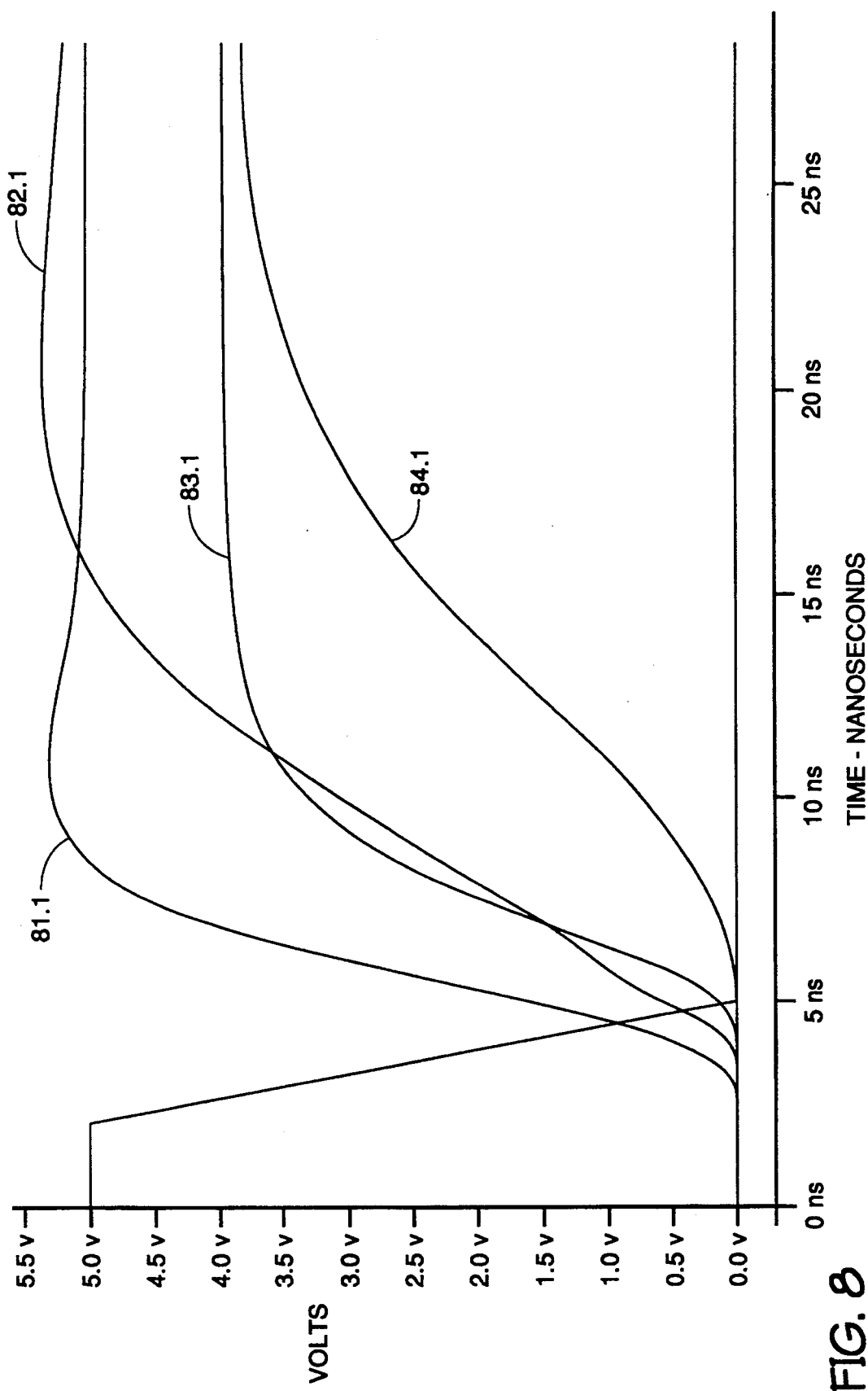
FIGS. 8 and 9 depicts operating voltage and current curves that compare a typical CMOS buffer/driver to that of an adjustable CMOS buffer/driver.
Figure 9:
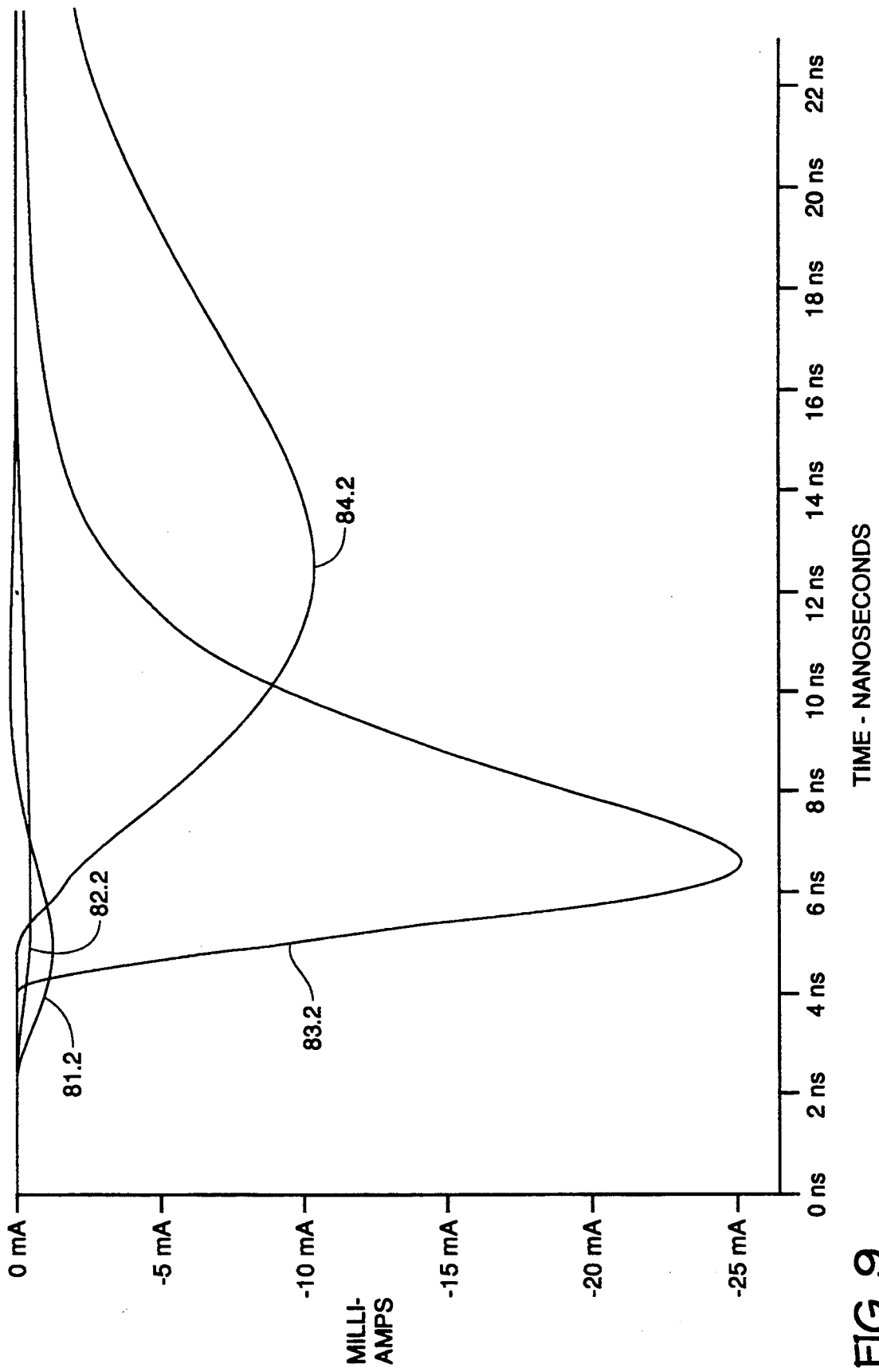

FIGS. 8 and 9 depict power operating curves (volts vs. time in FIG. 8 and current vs. time in FIG. 9) of a full output driver and buffer circuit to that of an adjustable (or partial) output driver and buffer depicted in FIG. 7. The table of FIG. 10 correlates the results of each output driver/buffer curve shown in FIG. 7.

Referring now to FIGS. 8, 9 and 10, voltage operating curve 81.1 and current operating curve 81.2 representing a typical driver (or full output driver) having a propagation delay of 4.5 ns @ 2.4 V and a peak operating current of 1.25 mA. Voltage curve 82.1 and current operating curve 82.2, representing an adjustable output driver that has been adjusted by either the bonding pad or fuse options, has a propagation delay of 12 ns @ 2.4 V and a peak operating current of 0.5 mA. The voltage operating curve 83.1 and current operating curve 83.2 representing a typical buffer (or full output buffer) has a propagation delay of 4.5 ns @ 2.4 V and a peak operating current of 25 mA. Curves 84.1 and 84.2, representing an adjustable output buffer that has been adjusted by either the bonding pad or fuse options, has a propagation delay of 12 ns @ 2.4 V and a peak operating current of 10.5 mA.

The full driver/buffer combination has a propagation delay of 4.5 ns @ 2.4 V while the adjustable (or partial) driver/buffer combination has a propagation delay of 12 ns @ 2.4 V The peak operating current is reduced from 26.25 mA to 11 mA. The adjustable driver/buffer combination realizes a 60 % reduction in operating power and a 7.5 ns increase in total propagation delay. Once again, the transistor sizing selected for each transistor will determine the amount of speed and power reduction gained.

It is to be understood that although the present invention has been described in a preferred embodiment, various modifications known to those skilled in the art may be made without departing from the invention as recited in the several claims appended hereto. For example, the present invention is described in view of its implementation into a buffer circuit or a driver/buffer circuit combination, however one skilled in the art may used only an adjustable driver circuit or an adjustable driver circuit (or a combination of the two as is preferred) depending on the desired results, without departing from the claimed invention.

What is claimed is:

1. An adjustable output driver/output buffer structure for a semiconductor device constructed on a substrate, said adjustable driver structure comprising:

a first and second potential;

a first set of electrical devices comprising a pair of serially connected p-channel adjusting devices connected in parallel with a p-channel pullup device, said first set of electrical devices connected serially between said first potential and a first CMOS inverter, said first set of electrical devices having control means for activating and deactivating said first set;

a second set of electrical devices comprising said first CMOS inverter electrically connected to a common drive node, said second set of electrical devices serially connected between said first set of electrical devices and said second potential;

a third set of electrical devices comprising a pair of serially connected n-channel adjusting devices connected in parallel with an n-channel pulldown device, said third set of electrical devices connected between said common drive node and said second potential, said third set of electrical devices having control means for activating and deactivating said third set;

a fourth set of electrical devices comprising a second CMOS inverter having its input terminals electrically connected together at said common drive node and its output terminals electrically connected together to form a common output node;

a fifth set of electrical devices comprising an n-channel transistor series stack electrically connected to said common ouptut node and a p-channel transistor series stack electrically connected to said common output node, said fifth set of electrical devices having control means for activating and deactivating said fifth set, said fourth and fifth sets of electrical devices performing an inverting function;

e) means for providing control signals to said control means; and f) control signal adjusting means to determine the states of said control signals.

2. The adjustable output driver/output buffer structure recited in claim 1 wherein said means for providing control signals comprises a set of series CMOS inverters providing a first control signal and a second control signal, said first and second control signals being of opposite polarity of one another.

3. The adjustable output driver/output buffer structure recited in claim 1 wherein said control signal adjusting means comprises a wire of bonding pad coupled to the inputs of said first, third, and fifth sets.

4. The adjustable output driver/output buffer structure recited in claim 1 wherein said control signal adjusting means comprises a fuse pad coupled to the inputs of said first, third, and fifth sets.

5. An adjustable output driver/output buffer structure for a semiconductor device constructed on a substrate, said adjustable driver structure comprising:

a) an adjustable output driver circuit; and b) an adjustable output buffer circuit;

said adjustable output driver circuit comprising:

a first driver transistor connected between a first potential source and a fourth driver transistor, said fourth transistor connected in series to said first transistor, said fourth transistor's output connected to a common drive node;

serially connected second and third driver transistors being connected parallel to said first driver transistor, the gates of said first and second driver transistors being connected together and the gate of said third driver transistor being connected to a first adjusting control signal;

a fifth driver transistor connected between said common drive node and a second potential source, the gates of said fourth and fifth transistors being connected together;

a sixth drive transistor connected in parallel to said fifth drive transistor; and serially connected seventh and eighth drive transistors, said seventh and eighth driver transistors being connected in parallel to said fifth and sixth driver transistor, the gates of said sixth and seventh buffer transistors being connected together and the gate of said eighth buffer transistor being connected to a second adjusting control signal;

said adjustable output buffer comprising:

a first driver transistor connected between a first potential source and a common output node, the gate of said first buffer transistor being connected to said common drive node;

serially connected second and third driver transistors, said second and third buffer transistors being connected in parallel to said first buffer transistor, the gates of said first and second buffer transistor being connected together and the gate of said third buffer transistor being connected to said second adjusting control signal;

a fourth buffer transistor connected between said common output node and said second potential source; and serially connected fifth and sixth buffer transistors, said fifth and sixth buffer transistors being connected in parallel to said fourth buffer transistor, the gates of said fourth and fifth buffer transistors being connected together and the gate of said sixth buffer transistor being connected to said second adjusting control signal.

6. The adjustable output driver/output buffer structure of claim 5 wherein said first, second, third and fourth driver transistors and said first, second and third buffer transistors are p-channel transistors and said fifth, sixth, seventh and eighth driver transistors and said fourth, fifth and sixth buffer transistors are n-channel transistors.

7. The adjustable output driver/output buffer structure of claim 5 wherein said first and second adjusting control signals are the complemented signals of each other.

8. The adjustable output driver/output buffer structure of claim 5 wherein said first and second potential sources are $V_{SS}$ and $V_{CC}$, respectively.

* * * * *